US010453775B1

(12) United States Patent
Carlson

(10) Patent No.: US 10,453,775 B1
(45) Date of Patent: Oct. 22, 2019

(54) DISTRIBUTED THERMOELECTRIC COOLING SYSTEM

(71) Applicant: SA Photonics, Inc., Los Gatos, CA (US)

(72) Inventor: Mark Carlson, Campbell, CA (US)

(73) Assignee: SA Photonics, Inc., Los Gatos, CA (US)

( * ) Notice: Subject to any disclaimer, the term of this patent is extended or adjusted under 35 U.S.C. 154(b) by 317 days.

(21) Appl. No.: 14/736,202

(22) Filed: Jun. 10, 2015

(51) Int. Cl.
*H01L 23/38* (2006.01)
*H01L 35/30* (2006.01)

(52) U.S. Cl.
CPC .............. *H01L 23/38* (2013.01); *H01L 35/30* (2013.01)

(58) Field of Classification Search
CPC ... H01L 35/32; H01L 35/34; H01L 35/30–34; H01L 23/28; F25B 21/02; F25B 21/04; G06F 1/20–206
See application file for complete search history.

(56) References Cited

U.S. PATENT DOCUMENTS

| 5,349,821 | A | * | 9/1994 | Schrage | ............... | F24F 5/0042 62/3.2 |
| 6,000,225 | A | * | 12/1999 | Ghoshal | ................. | F25B 21/02 62/3.7 |
| 6,161,388 | A | * | 12/2000 | Ghoshal | ................. | F25B 21/02 62/3.7 |
| 6,266,962 | B1 | * | 7/2001 | Ghoshal | ................. | F25B 21/02 62/3.3 |
| 6,300,150 | B1 | * | 10/2001 | Venkatasubramanian | ................... | B82Y 10/00 257/470 |
| 6,556,752 | B2 | * | 4/2003 | Fang | ...................... | H01L 23/38 257/E23.082 |
| 6,804,966 | B1 | * | 10/2004 | Chu | ........................ | F25B 21/02 257/E23.082 |
| 2003/0097845 | A1 | * | 5/2003 | Saunders | ............. | A41D 13/005 62/3.3 |
| 2003/0184941 | A1 | * | 10/2003 | Maeda | .................... | G06F 1/203 361/103 |

(Continued)

FOREIGN PATENT DOCUMENTS

WO    WO-2008067748 A1 *  6/2008    .............. F25B 21/02

*Primary Examiner* — Eli S Mekhlin
*Assistant Examiner* — William E McClain
(74) *Attorney, Agent, or Firm* — Fenwick & West LLP

(57) ABSTRACT

A thermoelectric module for cooling a heat source includes multiple major sections, each major section including multiple minor sections. Each minor section includes one or more thermoelectric cooler (TEC) units including P-type and N-type semiconductors. Each major section also includes a single output terminal commonly connected to the minor sections, where the output terminal is configured to provide a same reference voltage signal to each of the minor sections. Each major section also comprises multiple input terminals, where each input terminal is separately connected to one of the minor sections and each input terminal is configured to provide a separate input voltage signal to each of the minor sections. The module also comprises a controller configured to independently control each reference voltage signal applied to each major section, and independently control each input voltage signal applied to each input terminal of each minor section within each major section.

22 Claims, 6 Drawing Sheets

(56) References Cited

U.S. PATENT DOCUMENTS

| | | | | |
|---|---|---|---|---|
| 2006/0208492 | A1* | 9/2006 | Jovanovic | H01L 35/22 |
| | | | | 290/43 |
| 2006/0242967 | A1* | 11/2006 | Lin | H01L 21/67109 |
| | | | | 62/3.3 |
| 2007/0079616 | A1* | 4/2007 | Deal | F25B 21/02 |
| | | | | 62/3.7 |
| 2008/0134689 | A1* | 6/2008 | Shen | F25B 21/02 |
| | | | | 62/3.7 |
| 2008/0173022 | A1* | 7/2008 | Petrovski | B60N 2/5628 |
| | | | | 62/3.2 |
| 2010/0198204 | A1* | 8/2010 | Rogers | A61F 7/007 |
| | | | | 606/21 |
| 2010/0257871 | A1* | 10/2010 | Venkatasubramanian | |
| | | | | H01L 23/38 |
| | | | | 62/3.7 |
| 2011/0030754 | A1* | 2/2011 | Smythe | H01L 35/08 |
| | | | | 136/233 |
| 2011/0092072 | A1* | 4/2011 | Singh | C23C 14/541 |
| | | | | 438/710 |
| 2013/0072035 | A1* | 3/2013 | Gaff | F25B 21/04 |
| | | | | 438/798 |
| 2015/0354866 | A1* | 12/2015 | Stanley | F25B 21/02 |
| | | | | 62/3.7 |
| 2016/0018140 | A1* | 1/2016 | Stanley | F25B 21/04 |
| | | | | 62/3.3 |
| 2016/0018141 | A1* | 1/2016 | Edwards | F25B 21/04 |
| | | | | 62/3.3 |

* cited by examiner

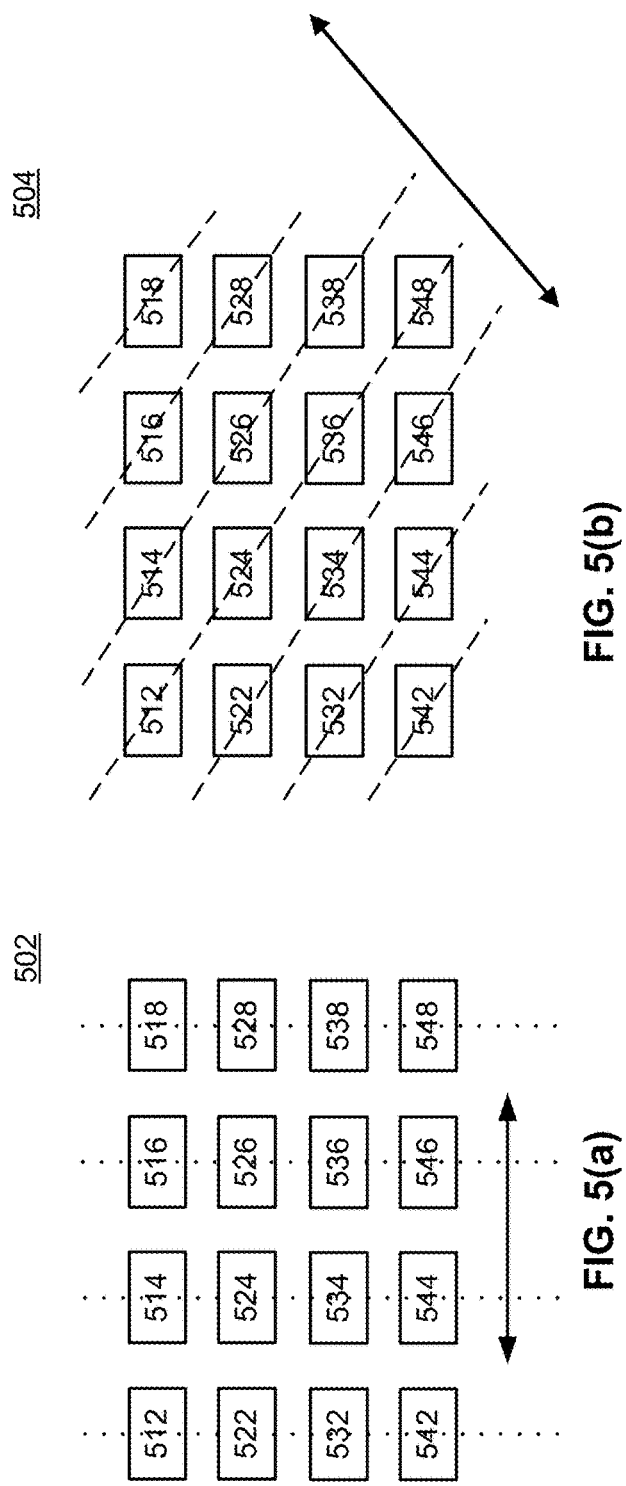
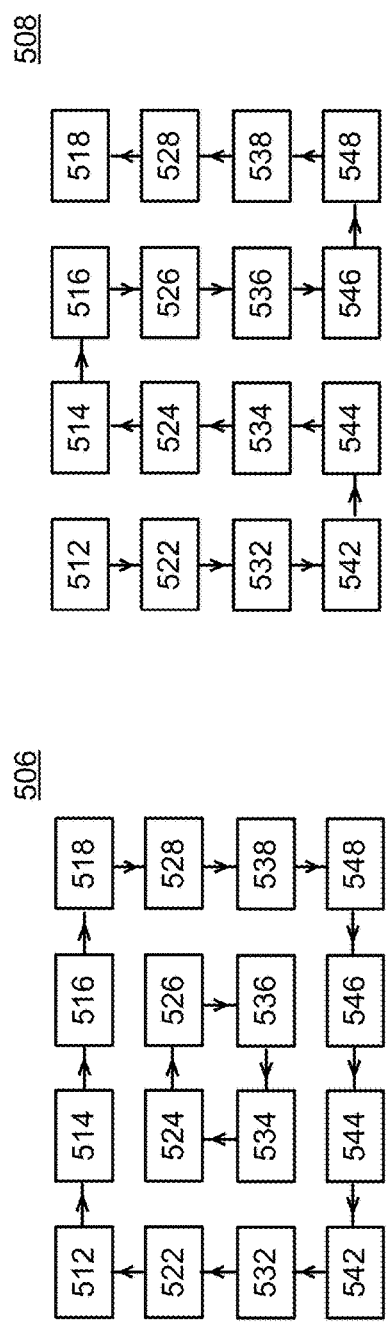

DISTRIBUTED THERMOELECTRIC COOLING SYSTEM

GOVERNMENT RIGHTS LEGEND

This invention was made with government support under SBIR Government contract FA9453-12-C-0122 awarded by the United States Air Force. The government has certain rights in the invention.

BACKGROUND

This disclosure generally relates to cooling systems and specifically to distributed thermoelectric cooling systems.

The complexity of integrated circuits (ICs) has been increasing dramatically resulting in an increase in the amount of heat generated by the ICs. The form factor of electronic devices comprising ICs is decreasing with time. For example, the latest mobile phones have a thickness form factor of less than 10 mm while their processors dissipate tens of watts of power.

Accordingly, it is becoming increasingly important for electronic devices to include cooling systems that can absorb heat from a heat source dissipating tens of watts of power, and spread the heat quickly and efficiently. Because the form factor of electronic devices is decreasing, cooling systems also should have smaller form factors. Cooling systems embedded in mobile electronic devices should be light weight as the weight of the mobile electronic devices such as smart phones is decreasing.

SUMMARY

The present invention overcomes the limitations of the prior art by implementing a thermoelectric module with a plurality of independently controllable major sections and minor sections of thermoelectric cooler (TEC) units. Each major section includes multiple minor sections and each minor section includes multiple TEC units.

In one example embodiment, the thermoelectric module for cooling a heat source includes a plurality of major sections. Each major section includes a plurality of minor sections, each minor section including a one or more TECs, where each TEC unit includes one or more P-type semiconductors and N-type semiconductors electrically connected in series by electrical contacts, the electrical contacts positioned to make thermal contact with a top header and a bottom header. Each major section also includes a single output terminal commonly connected to the minor sections, where the output terminal provides a same reference voltage signal to each of the minor sections. Each major section also includes a plurality of input terminals, where each of the input terminals is separately connected to one of the minor sections and each input terminal provides a separate input voltage signal to each of the minor sections. The module also includes a controller to independently control each reference voltage signal applied to each output terminal so that a different reference voltage signal is able to be applied to each major section. The controller also independently controls each input voltage signal applied to each input terminal so that a different input voltage signal is able to be applied to each minor section within each major section.

In one example embodiment, each major section of the plurality of major sections is configured to operate in two efficiency modes. The major section operates in a first efficiency mode when an input power of the heat source is lower than or equal to 25% of a maximum input power rating of the major section. The major section operates in a second efficiency mode when the input power of the heat source is higher than 25% of the maximum input power rating. An efficiency in the first efficiency mode is higher than an efficiency in the second efficiency mode.

Other aspects of the inventive concept include applications of the thermoelectric module described above, and methods corresponding to the operation of the foregoing.

BRIEF DESCRIPTION OF THE DRAWINGS

FIGS. 5a-5d are block diagrams illustrating different configurations of a thermoelectric module, according to example embodiments of the present disclosure.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Figure 1:
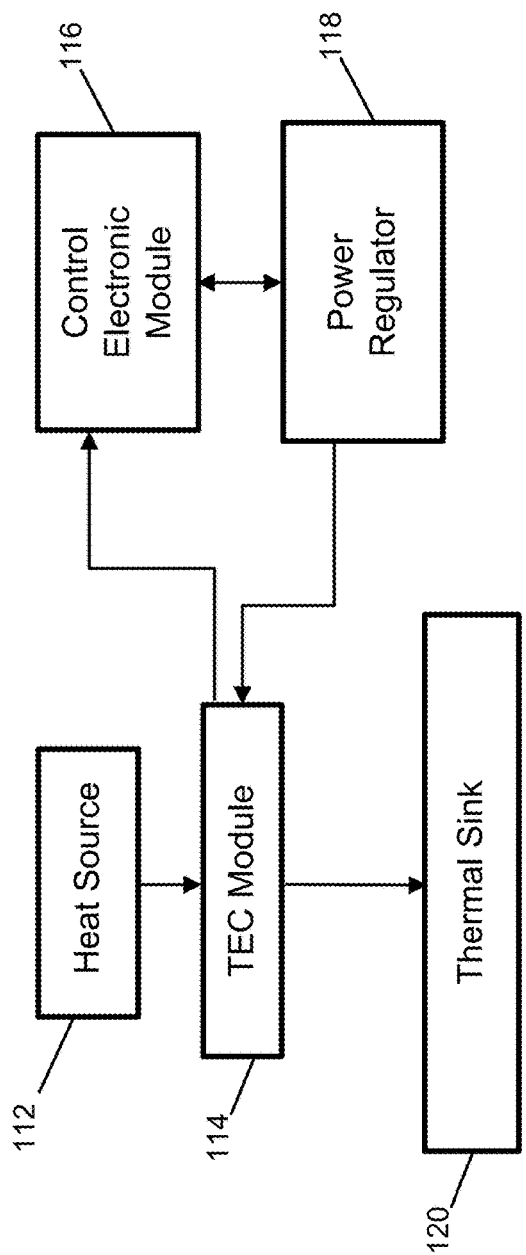
FIG. 1 is a block diagram of a distributed thermoelectric cooling system, according to an example embodiment of the present disclosure.

FIG. 1 is a block diagram illustrating a distributed thermoelectric cooling system, according to an example embodiment of the present disclosure. The cooling system 100 includes a heat source 112, a thermal sink 120, a thermoelectric cooler (TEC) module 114, control electronic module 116, and power regulator 118.

The heat source 112 can be any heat dissipating device to be cooled down. For example, the heat source 112 is an integrated circuit chip that dissipates heat when operating in an electronic device. Alternatively, the heat source 112 is the warm air being replaced by cool air in a refrigeration system. The heat from the heat source 112 is transferred to the thermal sink 120.

The TEC module 114 transfers heat from the heat source 112 to the heat sink 120. The heat transfer of the TEC module 114 is controlled by the control electronic module 116 and the power regulator 118. The control electronic module 116 senses a temperature of the TEC module 114. In one embodiment, the control electronic module 116 senses the temperature of the TEC module 114 at a plurality of zones within the TEC module 114. For example, if the TEC module 114 has four zones that can be independently controlled, the control electronic module 116 senses the temperature of each of the four zones independently. After sensing the temperature, the control electronic module 116 provides the temperature information to the power regulator 118. Each zone of the TEC module 114 comprises a plurality of TEC units, which are described below with reference to FIG. 2.

The power regulator 118 receives the temperature information from the control electronic module 116 and applies power to the TEC module 114. In one embodiment, the power regulator 118 applies power to a plurality of zones within the TEC module 114. In the above example where the TEC module 114 has four independently controlled zones, the power regulator 118 can provide power to each of the four zones independently. The power applied to the TEC module 114 can either be a constant voltage applied continuously, or a voltage signal that is turned-on and off periodically.

Figure 2:
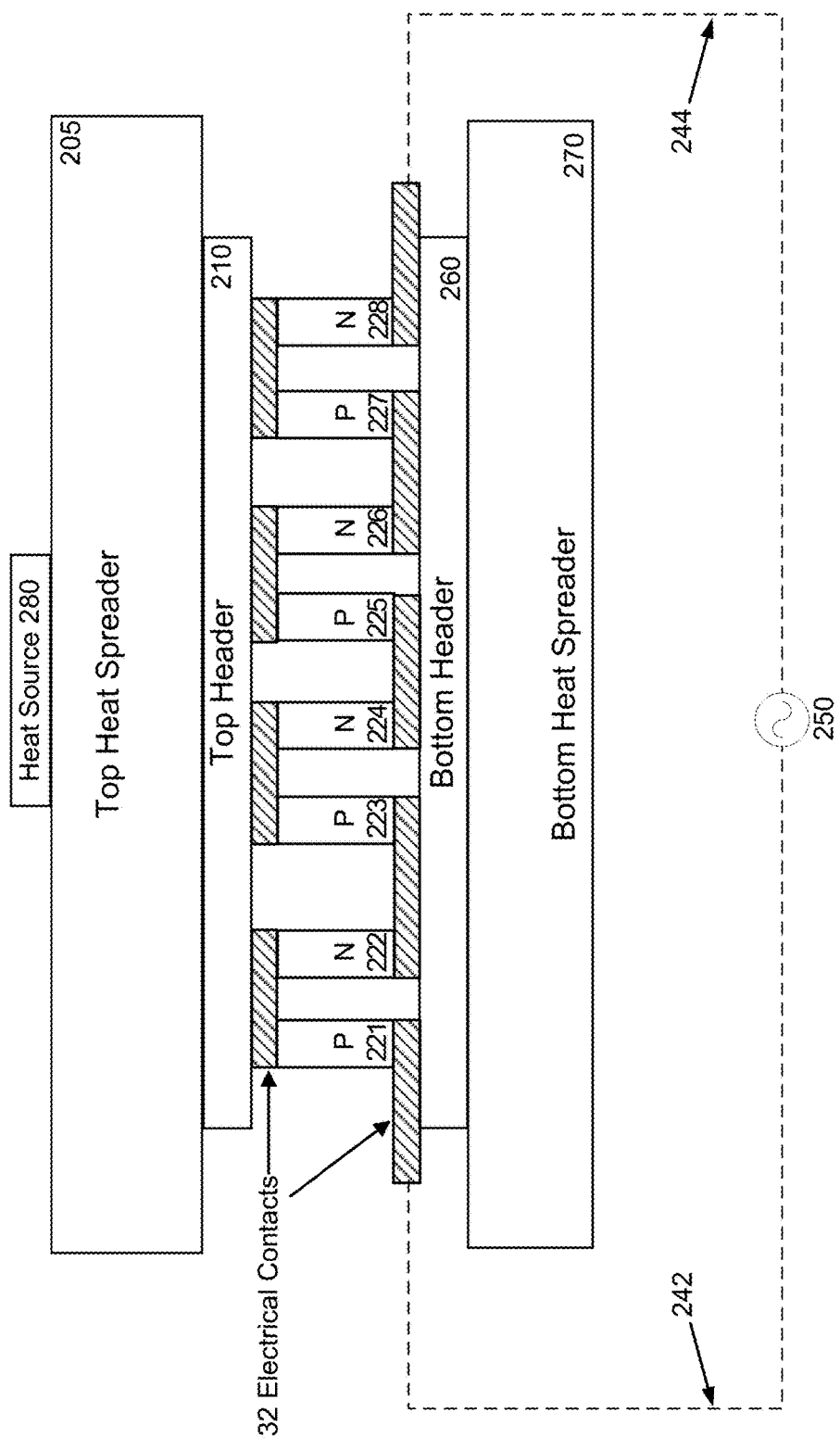
FIG. 2 is a block diagram illustrating a cross-section that includes a thermoelectric cooler unit, according to an example embodiment of the present disclosure.

FIG. 2 is a block diagram illustrating a cross-section of a portion 200 of the TEC module, including a thermoelectric cooler (TEC) unit, according to an example embodiment of the present disclosure. The TEC unit comprises a plurality of P-type and N-type semiconductors (e.g., 221 through 228) and electrical contacts 232. Other portions of the TEC module include two heat spreaders, a top heat spreader 205 and a bottom heat spreader 270; two headers, a top header 210 and a bottom header 260; and voltage source 250. The TEC unit 200 transfers heat from a heat source 280 placed on top of the top heat spreader 205 to a thermal sink (not shown) that is placed at the bottom of the bottom heat spreader 270.

The top heat spreader 205 is thermally coupled to the heat source 280 on one side and to the top header 210 on the other side. In one embodiment, the top header 210 comprises a set of headers, where each header corresponds to a set of TEC units. For example, each header of the set of headers can correspond to either a portion of a minor section, one full minor section or a major section described below with reference to FIG. 3. In one embodiment, the top heat spreader 205 is thermally coupled to the top header 210 using a liquid metal. The top heat spreader 205 is preferably made up from a conductive material such as a metal or ceramic material, and spreads the heat of the heat source 280 throughout the surface of the heat spreader, where the coefficient of thermal expansion (CTE) of the conductive material matches the CTE of the heat source 280 to be cooled. The top header 210 is a thermal conductor but electrical insulator. The top header 210 is thermally a conductor as it transfers heat from the top heat spreader 205 via the electrical contacts 232 to the P-type/N-type semiconductors (e.g., 221 through 228). At the same time, top header 210 is an insulator electrically so that it does not interfere with the current flow along the P-type and N-type semiconductors described below. For example, an epoxy resin is a thermally conductive material but has excellent electrical insulation. Other example thermally conductive materials that are electrical insulators include thermally conductive ceramics and composites.

The TEC unit 200 includes a plurality of P-type and N-type semiconductors that aid in transferring the heat from the heat source 280 to the bottom heat spreader 270. The P-type and N-type semiconductors are heavily doped semiconductors such as bismuth telluride. In one example embodiment, the plurality of P-type and N-type semiconductors are electrically connected in series such that P-type 221 is coupled to N-type 222 that is further coupled to P-type 223, which is further coupled to N-type 224, and so on. That is, when current flows through the P-type and N-type semiconductors, the current flows in series through the serially connected alternating P-type and N-type semiconductors. Each P-type semiconductor is connected to an adjacent N-type semiconductor using an electrical contact 232 that is a good conductor of both heat and electricity (e.g., metal like copper). Alternatively, the plurality of P-type and N-type semiconductors are coupled electrically in a combination of series and parallel configurations. A combination of series and parallel connections provides a flexibility to design the TEC unit 200 either in series or in parallel to balance the overall resistance of the TEC unit 200, and to add robustness to the TEC unit 200. The robustness results in, for example, when a parallel connection is used since if one leg of the parallel connection is broken, other legs of then parallel connection still work without rendering the entire TEC unit 200 broken. By varying the connections in series and parallel (e.g., section by section), the resistance in the TEC unit 200 can be balanced. A voltage signal can be applied across the P-type and N-type semiconductors using a voltage source 250 through wires 242 and 244 to control the heat transfer as described below.

While the plurality of P-type and N-type semiconductors are coupled with each other electrically in series, the plurality of P-type and N-type semiconductors are placed in a thermally parallel configuration for transferring heat from one end to the other. As shown in FIG. 2, The P-type and N-type semiconductors are placed in between the top header 210 and bottom header 260 using electrical contacts 232. In one embodiment, the bottom header 260 comprises a set of headers, where each header corresponds to a set of TEC units. For example, each bottom header of the set of headers can correspond to either a portion of a minor section, one full minor section, or one full major section. The bottom header 260 is coupled to the bottom heat spreader 270 using a thermally conductive compound such as liquid metal and the bottom heat spreader 270 is further coupled to a separate thermal sink at its bottom. In one embodiment, a TEC unit includes one P-type semiconductor (e.g., 221) and one N-type semiconductor (e.g., 222) only. Alternatively, a TEC unit may include a plurality of P-type and N-type semiconductors.

An operation of the TEC unit 200 is based on the Peltier-effect as follows. When DC current flows through the plurality of P-type and N-type semiconductors, heat from one end of the P-type and N-type semiconductors (e.g., top end) is transferred to the other end (e.g., bottom end). The rate of heat transfer can be controlled by the number of TEC units coupled between the heat source and sink, and also by the amount of current passing through the TEC units. For example, the rate of heat transfer (or cooling) is proportional to the current passing through the TEC units, and also the number of TEC units coupled thermally in parallel between the heat source and sink.

The voltage source 250 applies a voltage signal across the plurality of P-type and N-type semiconductors. In one example embodiment, the voltage signal is a constant voltage applied continuously. Alternatively, the voltage signal is cycled to turn ON and OFF periodically. A measure of the efficiency of the TEC unit is a coefficient of performance (COP) of the TEC unit. The COP is defined as a ratio of an amount of power (from heat source) the TEC is cooling (P1)

to the amount of power the TEC unit receives to perform such cooling (P2). The COP is further defined such that a temperature delta between the heat source and heat sink is within a specified limit. For example, a temperature delta should not exceed 1 degree centigrade. The COP of the TEC unit can be varied by varying a current flowing through the TEC unit. The varying current can be achieved by varying the voltage signal applied to the TEC unit. Alternatively, the current can be varied by cycling the voltage signal between turning ON and OFF to present an average voltage value.

A thermoelectric module (TEM) can comprise a plurality of TEC units. The TEM can be configured to comprise multiple major sections, where each major section comprises multiple minor sections and each minor section comprises multiple TEC units. A configuration including multiple major and minor sections of TEC units is advantageous as it provides flexibility to control the TEC units of the major and minor sections independently based on the heat source being cooled. A specific structural implementation of the TEM as multiple major and minor sections of the TEC units, and its operation is described below with reference to FIGS. 3 and 4. FIG. 5 shows alternate configurations of the TEM module.

Figure 3:
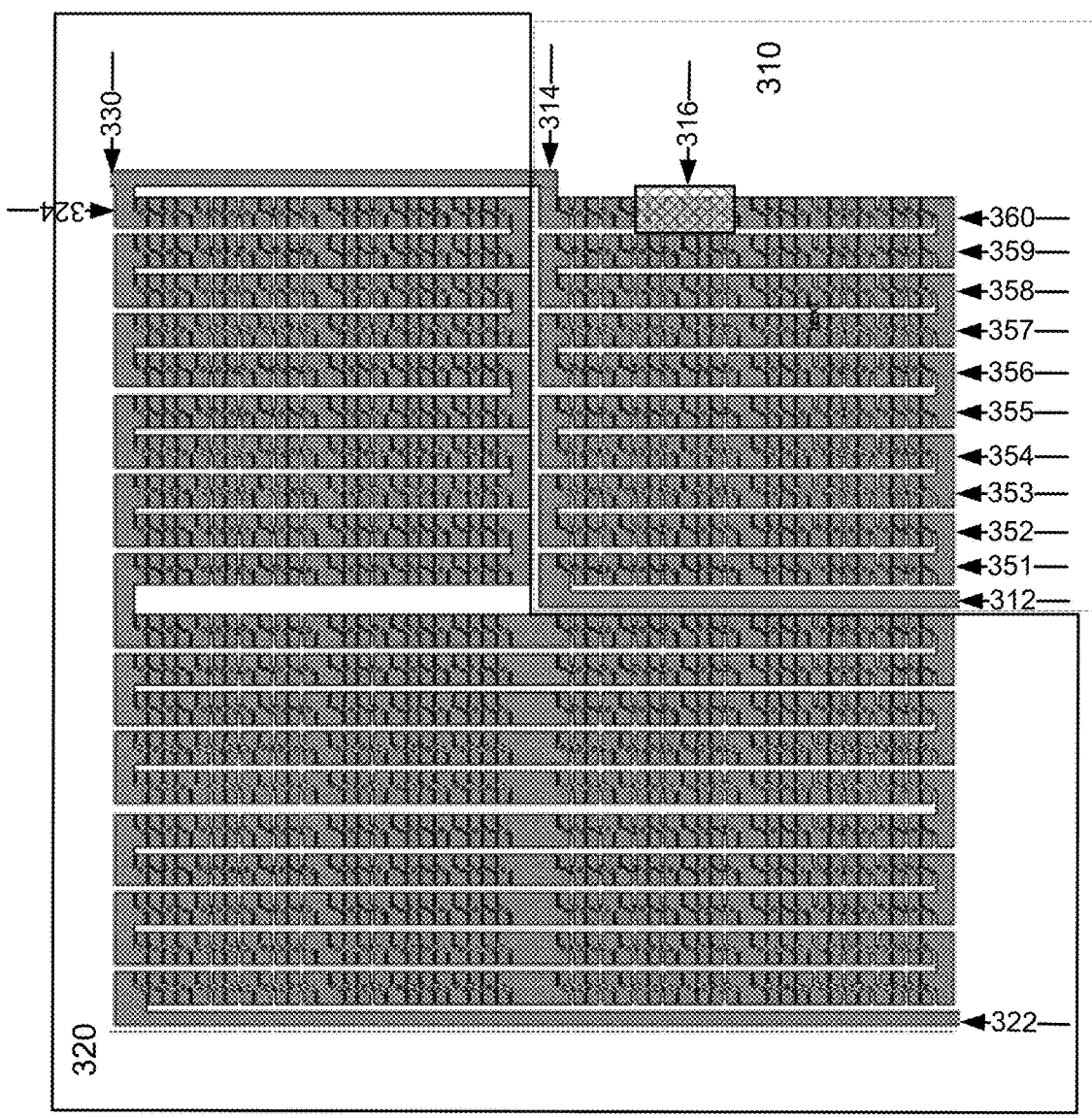
FIG. 3 is a block diagram illustrating a major section of a thermoelectric module, according to an example embodiment of the present disclosure.

FIG. 3 is a block diagram illustrating a major section of a thermoelectric module, according to an example embodiment of the present disclosure. FIG. 3 is a top view of the major section 300 and depicts only the plurality of P-type and N-type semiconductors that are coupled with each other using electrical contacts, as described above with reference to FIG. 2. Major section 300 includes a plurality of minor sections such as minor section 310 and minor section 320. Each minor section further includes a plurality of TEC units, for example box 316 depicts one TEC unit as described above with reference to FIG. 2. While FIG. 3 depicts a major section with only two minor sections, it is understood that the subject matter described in FIG. 3 is not limited to two minor sections and can be extended to any number of minor sections. In one embodiment, each minor section is an independently controllable zone. Alternatively, two or more minor sections can constitute an independently controllable zone.

The major section 300 comprises two input terminals 312 and 322 for the two minor sections 310 and 320 respectively. The major section 300 includes one output terminal 330 that serves as output terminal for both minor sections. A voltage signal can be applied across the input and output terminals of each minor section. In the example embodiment depicted in FIG. 3, the output terminal 330 is coupled to a reference voltage such that all minor sections are provided with the same reference voltage (e.g., 0V) to one end of their TEC units (e.g., similar to either wire 242 or 244 of FIG. 2). The input terminals of the minor sections can each be configured to provide a separate input voltage signal to each of the minor sections. For example, input terminal 312 for minor section 310 can be provided with a 1V signal and input terminal 322 for minor section 320 can be provided with a 2V signal. In another example, input terminal 312 is provided with a constant voltage value and input terminal 322 is provided with a voltage signal that is turned ON/OFF periodically. Alternatively, both the input terminals 312 and 322 are provided with the same voltage signal.

While each minor section has an output terminal 314 and 324, in the embodiment of FIG. 3, these two output terminals are connected to form a single output terminal 330. Each minor section 310 and 320 can be independently controlled by having an ability to apply distinct voltages to separate input terminals 312 and 322. Alternatively, each minor section can have its own separate output terminal in addition a separate input terminal. In one example embodiment, the TEC units are implemented in thin film technology to reduce the size and weight of the TEM, and to reduce the TEM's response time for cooling the heat source after an input voltage is applied across the TEM.

In one example embodiment, the major section 300 can be operated in at least two efficiency modes. In a first efficiency mode, an input power of the heat source to be cooled is lower than or equal to percentage of a maximum input power rating of the major section. For example, in the first efficiency mode the major section 300 that is designed to theoretically cool a 500 W heat source (i.e., major section with a maximum input power rating of 500 W) can actually be operated to cool a heat source of 125 W or less (i.e., less than or equal to 25% of maximum power rating). Other example embodiments can include first efficiency mode that can handle heat sources with input powers that can be either 5%, 10%, or 20% of the maximum input power rating of the major section.

In a second efficiency mode, an input power of the heat source to be cooled is greater than the percentage of the maximum input power rating specified in the first efficiency mode. For example, if the specified percentage of the maximum input power rating of the major section in the first efficiency mode is 25%, the second efficiency mode includes input power of the heat source that is higher than 25% (e.g., higher than 125 W heat source for a major section designed to cool a heat source of up to 500 W) of the maximum input power that can be handled by the major section. The efficiency (e.g., COP) in the first efficiency mode can be different from the efficiency in the second efficiency mode. In one example embodiment, the efficiency in the first efficiency mode is higher than the efficiency in the second efficiency mode. For example, a COP in the first efficiency mode is greater than 10 whereas the COP in the second efficiency mode is less than 10.

Each minor section of the embodiment of FIG. 3 further comprises multiple legs, where each leg includes a plurality of TEC units. The current flow in the minor section 310 is as follows. When a voltage signal is applied between input terminal 312 and output terminal 330, current flows from the input terminal 312 through the legs 351 through 360 serially before reaching the output terminal 330. The current flow for the minor section 320 is similar between input terminal 322 and output terminal 330. As described in FIG. 2, the plurality of TEC units is configured to be electrically series and thermally parallel. For the thermally parallel configuration, the heat source and sink are coupled on either surface of the minor sections. Because FIG. 3 depicts a top view of the TEM, the heat source and sink are coupled on the top and bottom surfaces of the major section 300. While FIG. 3 depicts a single major section 300, FIG. 4 describes a specific example embodiment with multiple major sections.

Figure 4:
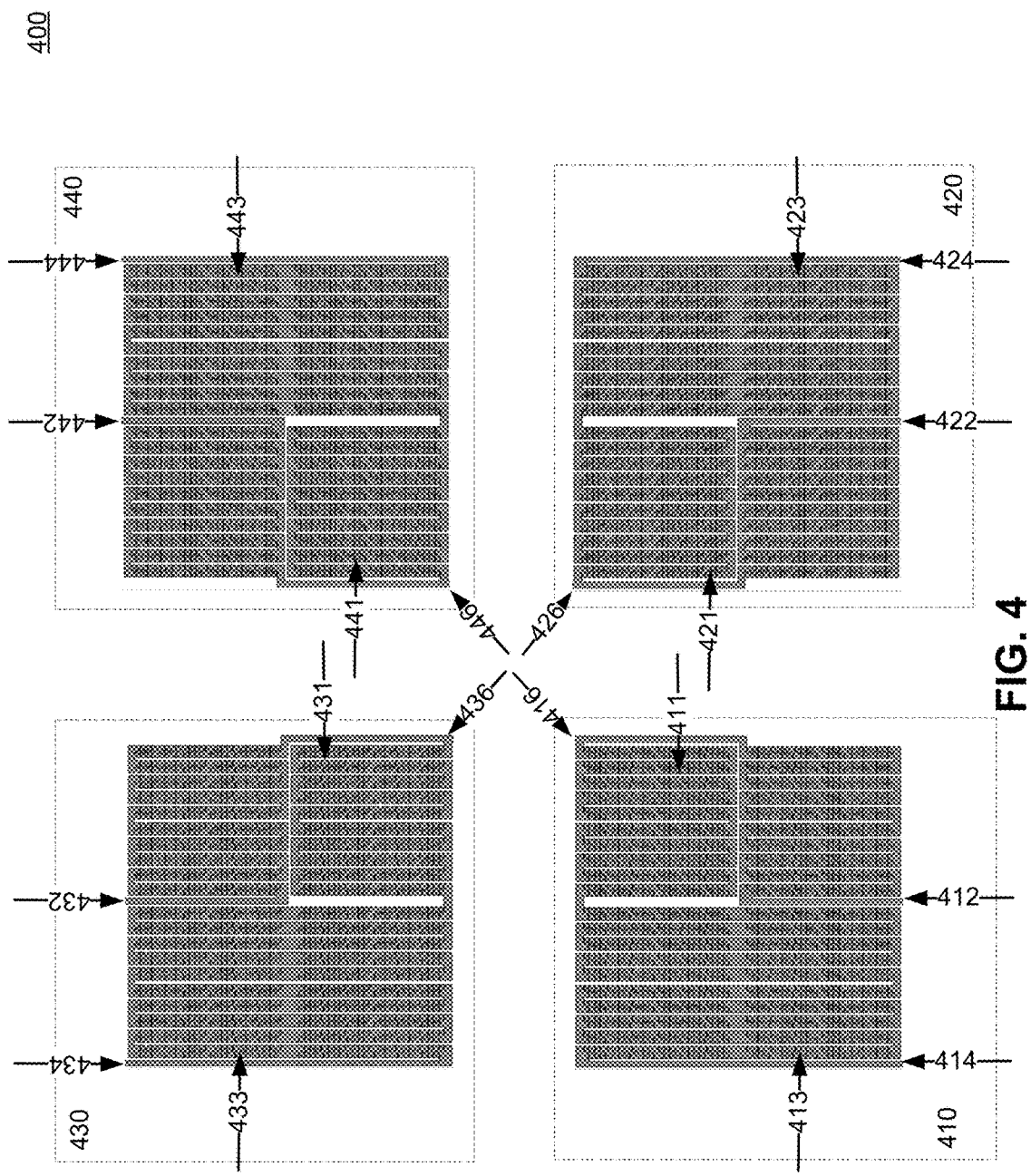
FIG. 4 is a block diagram illustrating a specific configuration of major sections of a thermoelectric module, according to an example embodiment of the present disclosure.

FIG. 4 is a block diagram illustrating a specific configuration of major sections of a thermoelectric module, according to an example embodiment of the present disclosure. FIG. 4 shows a top view of a TEM 400 that includes four major sections 410, 420, 430, and 440, where each of the major sections is identical to the major section 300 described above with reference to FIG. 3. Each of the major sections 410, 420, 430, and 440 are identical in structure and are arranged in a square shape such that the smaller minor sections (e.g., 411, 421, 431, and 441) of the major sections are placed close to each other. That is, the configuration comprises an inner ring of minor sections (i.e., (e.g., 411, 421, 431, and 441) and an outer ring of minor sections (e.g., 413, 423, 433, and 443).

Each major section of TEM 400 has separate input terminals for each minor section and a common output terminal. For example, major section 410 includes input terminals 412 and 414, and a common output terminal 416. Accordingly, TEM 400 includes a total of eight minor sections that can be independently controlled by applying separate voltage signals to the respective minor section. For example, each of the minor sections 411, 413, 421, 423, 431, 433, 441, and 443 can be applied with a separate voltage signals to control them independently. In one example embodiment, each of the eight separate voltages (applied through eight separate input terminals) has the same voltage value. Alternately, at least one of the eight separate voltage signals has a different voltage value compared to the other voltage signals. For example, all eight voltage signals can have eight different voltage values thereby including an ability to control each minor section of the TEM 400 independent from every other minor section.

In one example embodiment, TEM 400 is configured such that the heat source is placed at the center of the four major sections. One method of operating TEM 400 is to apply power to the four minor sections of TEM 400 that are closer to its center (i.e., 411, 421, 431, and 441) first, and then to apply power to the other four minor sections (i.e., 413, 423, 433, and 443). In one embodiment, the process of applying power first to the four minor sections closer to the center and then to the other four minor sections is repeated periodically. Alternatively, both sets of minor sections (inner and outer) can be applied with power at the same time.

An operation of the TEM 400 is controlled by a controller (not shown). The controller is configured to be able to independently control each reference voltage signal applied to each output terminal of each major section so that a different reference voltage signal is able to be applied to each major section of the TEM 400. For example, each of the output terminals 416, 426, 436, and 446 can be provided with a different reference voltage signal. In another example, two or more of the output terminals can have the same reference voltage signal provided to them.

The controller is further configured to independently control each input voltage signal applied to each input terminal of each minor section so that a different input voltage signal is able to be applied to each minor section within each major section. For example, minor sections 411 and 413 of major section 410 can be applied with different input voltage signals. Similarly, all eight minor sections of TEM 400 can be applied with different input voltage signals. In another example, the controller controls the operation of the TEM 400 such that two or more of the eight minor sections are applied with the same input voltage signal. Accordingly, the controller has a lot of flexibility to control the operation of multiple minor sections of TEM 400.

Some exemplary methods of operating the multiple major and minor sections of TEM 400 are described below. In one example embodiment, a same input voltage signal is applied to each of the multiple input terminals of each major section, wherein the same input voltage signal has a constant voltage value. Alternatively, the same input voltage signal that is applied to each of the multiple input terminals of each major section is periodically turned on and turned off. For example, a voltage value of the input voltage signal switches from zero to 2V at a specific duty cycle.

In another example embodiment, a different input voltage signal is applied to each of the multiple minor sections of each major section, wherein each of the different input voltage signals has a constant voltage value. Alternatively, at least one of the different input voltage signals to the multiple minor sections of each major section is periodically turned on and turned off. For example, only one voltage signal out of a maximum eight different voltage signals (four major sections with each two minor sections) for TEM 400 is periodically cycled. In another example, all eight voltage signals are periodically cycled.

FIGS. 5a-5d are block diagrams illustrating different configurations of a TEM, according to example embodiments of the present disclosure. Each of the FIGS. 5a-5d depict multiple minor sections of a TEM. For example, each of blocks 512, 514, 516, and 518 represents a minor section of the TEM. Alternatively, each of those blocks represents a major section that further includes multiple minor sections of the TEM. Each block shown in FIGS. 5a-5d (e.g., blocks 512, 514, etc.) can be independently controlled by separate input voltage signals as described above with reference to FIGS. 3 and 4.

FIG. 5a depicts a TEM 502 configuration where minor sections (e.g., 512, 514, etc.) are controlled such that a common input voltage signal is applied to a column of minor sections (as depicted by a vertical dotted line) at a time. For example, a first column of minor sections 512, 522, 532, and 542 are all provided with a same first input voltage signal at the same time. Then, a second column of minor sections immediately to the right of the first column (i.e., 514, 524, 534, and 544) are powered next with a same second voltage signal that is different from the first voltage signal. This process of powering columns of minor sections can be continued for all columns in the TEM 502. Alternatively, the columns can be powered up from right to left instead of left to right.

FIG. 5b depicts a TEM 504 configuration where minor sections are controlled in a diagonal fashion from one corner to the opposite corner. That is, each diagonal line drawn through the minor sections represents a group of minor sections that would be controlled at a same time. For example, a first diagonal line through minor section 542 is powered on first. Then, a second diagonal line comprising minor sections 532 and 544 are powered on, and so on. The TEM 504 can be controlled from bottom left corner to the top right corner, or vice versa based on the location of the heat source among other things.

FIG. 5c depicts a TEM 506 that comprises two rings, an outer ring and an inner ring. Each minor section in each ring can be controlled separately. One method of controlling the minor sections is to sequentially power on each minor section of a ring. For example, the method first powers on section 512, then 514, and then 516, etc., until it reaches to section 522, to complete the outer ring. Similarly, the sections of the inner ring can be powered in an order comprising sections 524, 526, 536, and 534 as shown by arrows.

Finally, FIG. 5d depicts a TEM 508 that controls its minor sections sequentially from top to bottom in a column (e.g., 512, 522, 532, and 542), and then from bottom to top of the next column (e.g., 544, 534, 524, and 514). It is understood that the depicted configurations of FIGS. 5a-5d are merely exemplary and any number of different configurations can be designed based on one or more heat sources being cooled by the cooling system.

Figure 6:
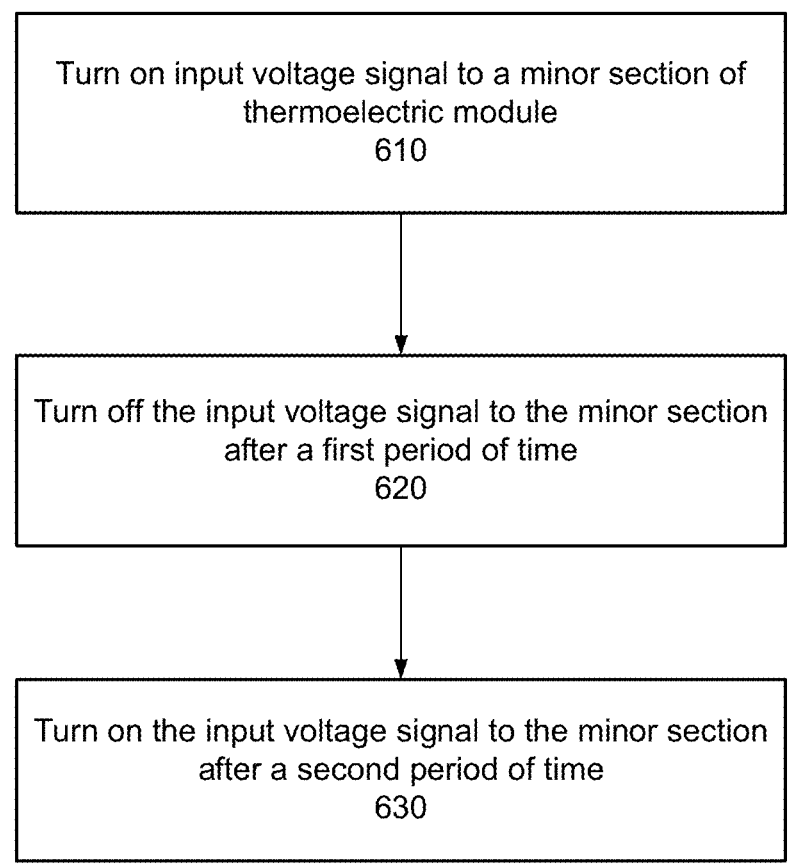
FIG. 6 is a flowchart illustrating a process for operating a thermoelectric module, according to an example embodiment of the present disclosure.

FIG. 6 is a flowchart illustrating a process for operating a thermoelectric module, according to an example embodiment of the present disclosure. The TEM operated by method 600 can be any one of the TEMs described above with reference to FIGS. 2-5. The TEM comprises a plurality of major sections, where each of the major sections comprises a plurality of minor sections of TEC units.

The method includes turning on 610 an input voltage signal to a minor section of the plurality of minor sections of a major section of the TEM. When the minor section is turned on, the minor section transfers heat from the heat source to the heat sink proportional to the current flow in the TECs of the minor section. To have a control on the operation of the minor sections (and major sections), the minor section should be able to be turned off and on at arbitrary time intervals.

After a first time period from when the minor section is turned on, the voltage signal to the minor section is turned off 620. A result of turning off one or more minor sections of the TEM is to reduce the input power consumed by the TEM. After a second time period from when the minor section is turned on, the voltage signal to the minor section is turned on 630 again. A voltage value of the voltage signal while turning on the minor section the second time around can be different from the voltage signal while turning on for the first time. It is understood that the second time period is larger than the first time period.

Some embodiments may be described using the expression "coupled" or "connected." It should be understood that these terms are not intended as synonyms for each other. The term "connected" indicates that the connected elements are in direct thermal or electrical contact with each other. The term "coupled" includes the case where the coupled elements are in direct thermal or electrical contact but it also includes the case where the coupled elements are not in direct contact with each other, but still co-operate or interact with each other. In particular, there may be intervening elements.

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A thermoelectric module for cooling a heat source, the thermoelectric module comprising:
   a plurality of major sections, each major section comprising:
      a plurality of minor sections, each minor section including a plurality of legs, each of the legs including a plurality of thermoelectric cooler (TEC) units electrically connected in series, the legs physically arranged in parallel lengths relative to each other and electrically connected in series at ends of the legs, each TEC unit comprising one or more P-type semiconductors and N-type semiconductors electrically connected in series by electrical contacts, the electrical contacts positioned to make thermal contact with a top header and a bottom header, wherein the top headers or the bottom headers for all of the minor sections within the major section comprise a common header shared by all of the minor sections within the major section;
      a single output terminal commonly electrically connected to a terminal one of the TEC units in each of the minor sections, the output terminal configured to provide a same reference voltage signal to each of the terminal TEC units of the minor sections of that major section;
      a plurality of input terminals, each of the input terminals separately electrically connected to an initial one of the TEC units in each one of the minor sections, each input terminal configured to provide a separate input voltage signal to each of the minor sections within the major section; and
   a controller configured to:
      independently control each reference voltage signal applied to each output terminal so that a different reference voltage signal is able to be applied to each major section, and
      independently control each input voltage signal applied to each input terminal so that a different input voltage signal is able to be applied to each minor section within each major section.

2. The thermoelectric module of claim 1, wherein each major section of the plurality of major sections is configured to operate in two efficiency modes, the major section operating in a first efficiency mode when an input power of the heat source is lower than or equal to 25% of a maximum input power rating of the major section, and the major section operating in a second efficiency mode when the input power of the heat source is higher than 25% of the maximum input power rating, wherein an efficiency in the first efficiency mode is higher than an efficiency in the second efficiency mode.

3. The thermoelectric module of claim 1, wherein the TEC units are implemented using thin film technology.

4. The thermoelectric module of claim 1, wherein the P-type semiconductors of each TEC unit are coupled in series with the N-type semiconductors of the TEC unit through electrical conductors.

5. The thermoelectric module of claim 4, wherein, within each minor section, the one or more TEC units are connected electrically in series and coupled thermally in parallel.

6. The thermoelectric module of claim 5, wherein the one or more TEC units are coupled electrically in series such that a first P-type semiconductor of a first TEC unit is coupled electrically in series with a last N-type semiconductor of the first TEC unit and the last N-type semiconductor of the first TEC unit is connected electrically in series with a first P-type semiconductor of a second TEC unit.

7. The thermoelectric module of claim 6, wherein the first P-type semiconductor of the second TEC unit is coupled electrically in series with a last N-type semiconductor of the second TEC unit and the last N-type semiconductor of the second TEC unit is connected electrically in series with a first P-type semiconductor of a third TEC unit.

8. The thermoelectric module of claim 5, wherein the one or more TEC units are coupled thermally in parallel such that one end of each P-type semiconductor and N-type semiconductor of each TEC unit is coupled to the heat source, and the other end of each P-type semiconductor and N-type semiconductor of each TEC unit is coupled to a heat sink.

9. The thermoelectric module of claim 4, wherein the one or more TEC units are coupled electrically in a combination of series and parallel configurations.

10. The thermoelectric module of claim 1, wherein a same constant input voltage signal is applied to each of the plurality of input terminals of each major section.

11. The thermoelectric module of claim 1, wherein a same input voltage signal is applied to each of the plurality of input terminals of each major section, and the same input voltage signal is periodically turned on and turned off.

12. The thermoelectric module of claim 1, wherein a different but constant input voltage signal is applied to each of the plurality of input terminals of each major section.

13. The thermoelectric module of claim 12, wherein at least one of the different input voltage signals is periodically turned on and turned off.

14. The thermoelectric module of claim 1, wherein:
the top headers are thermally coupled between the plurality of major sections and a top heat spreader, the top heat spreader coupled thermally to the heat source; and
the bottom headers are thermally coupled between the plurality of major sections and a bottom heat spreader.

15. The thermoelectric module of claim 14 wherein the top heat spreader is coupled thermally to the top headers using a thermally conductive compound and the bottom heat spreader is coupled thermally to the bottom headers using the thermally conductive compound.

16. The thermoelectric module of claim 1, wherein the controller is further configured to:
maintain an efficiency mode wherein the controller:
deactivates, for a first time period, a first subset of one or more minor sections in a major section and activates a second subset of one or more minor sections in the major section, and
activates, for a second time period separate from the first time period, the first subset of minor sections and deactivates the second subset of minor sections, the efficiency mode maintaining a constant average output power over the first and second time periods.

17. The thermoelectric module of claim 16, wherein the controller is configured to maintain a second efficiency mode wherein the controller independently activates all of the minor sections in the major section at a second constant average output power such that the second constant average output power is less than the constant average output power.

18. The thermoelectric module of claim 1, wherein the single output terminal commonly connected to the minor sections is a ground terminal.

19. The thermoelectric module of claim 1, wherein the TEC units are connected in series across the minor sections.

20. The thermoelectric module of claim 1, wherein the single output terminal of the major section is between minor sections within the same major section.

21. The thermoelectric module of claim 1, wherein the legs of each minor section are substantially equal in length.

22. The thermoelectric module of claim 1, wherein the top headers are in thermal contact with a top heat spreader, the top heat spreader being in thermal contact with the heat source and having a coefficient of thermal expansion (CTE) matching a CTE of the heat source.

* * * * *